(12) United States Patent
Sattler et al.

(10) Patent No.: US 6,904,112 B1
(45) Date of Patent: Jun. 7, 2005

(54) METHOD FOR MODULATING A BASIC CLOCK SIGNAL FOR DIGITAL CIRCUITS AND CLOCK MODULATOR FOR IMPLEMENTING THE METHOD

(75) Inventors: Frank Sattler, Babenhausen (DE); Walter Klumb, Mommenheim (DE)

(73) Assignees: Mannesmann VDO AG, Frankfurt (DE); Fujitsu Microelectronics Europe, GmbH, Dreieich-Buchschlag (DE)

( * ) Notice: Subject to any disclaimer, the term of this patent is extended or adjusted under 35 U.S.C. 154(b) by 844 days.

(21) Appl. No.: 09/617,450

(22) Filed: Jul. 17, 2000

(30) Foreign Application Priority Data

Jul. 19, 1999 (DE) .......................................... 199 33 115

(51) Int. Cl.[7] ................................................ H04L 7/04
(52) U.S. Cl. ........................ 375/362; 370/517; 327/161
(58) Field of Search ................................. 375/239, 370, 375/373, 362; 370/213, 516, 517, 519; 327/153, 161

(56) References Cited

U.S. PATENT DOCUMENTS

| | | | |
|---|---|---|---|
| 4,933,890 A | | 6/1990 | Nuytkens et al. |
| 5,252,867 A | | 10/1993 | Sorrells et al. |
| 5,471,165 A | | 11/1995 | Liedberg |
| 5,638,017 A | | 6/1997 | Kim |
| 5,777,501 A | | 7/1998 | AbouSeido |
| 5,789,958 A | | 8/1998 | Chapman et al. |
| 5,805,616 A | * | 9/1998 | Oh .............................. 714/784 |
| 5,945,862 A | * | 8/1999 | Donnelly et al. ............ 327/278 |
| 6,040,726 A | * | 3/2000 | Martin ......................... 327/175 |
| 6,065,127 A | * | 5/2000 | Aizenberg et al. ........... 713/401 |
| 6,259,467 B1 | * | 7/2001 | Hanna .......................... 347/249 |
| 6,390,579 B1 | * | 5/2002 | Roylance et al. .............. 347/9 |
| 6,393,078 B1 | * | 5/2002 | Sattler ......................... 375/346 |
| 6,400,735 B1 | * | 6/2002 | Percey ........................ 370/518 |

FOREIGN PATENT DOCUMENTS

| | | |
|---|---|---|
| DE | 4423186 | 1/1995 |
| DE | 4442403 | 9/1996 |
| DE | 19517265 | 11/1996 |
| DE | 19546805 | 1/1997 |
| DE | 19802065 | 7/1999 |
| EP | 0828360 | 3/1998 |
| WO | 9858449 | 12/1998 |

* cited by examiner

Primary Examiner—Young T. Tse
(74) Attorney, Agent, or Firm—Martin A Farber

(57) ABSTRACT

A method for modulating a basic clock signal for digital circuits, in which distances between adjacent switching edges are altered, the basic clock signal being conducted via a changing number of delay units for altering the distances between the adjacent switching edges, the method comprising the step of calibrating delay times of the delay units (D1–Dn), wherein the delay units (D1–Dn) each have a plurality of delay elements (10) which are controlled to impart zero delay or a non-zero value of delay to a clock signal individually or in groups of the display elements; wherein the respective distance between two adjacent switching edges is derived from numbers of a random number generator; and wherein the distance between two successive switching edges is derived as a function of the random number and a modulation factor.

2 Claims, 6 Drawing Sheets

METHOD FOR MODULATING A BASIC CLOCK SIGNAL FOR DIGITAL CIRCUITS AND CLOCK MODULATOR FOR IMPLEMENTING THE METHOD

FIELD AND BACKGROUND OF THE INVENTION

The invention relates to a method for modulating a basic clock signal for digital circuits and a clock modulator for modulating a basic clock signal for digital circuits. Modulation of the basic clock signal is used in order to give interference caused by the basic clock signal a broader-band configuration and thus to distribute the interference energy between additional frequencies and hence to reduce the absolute heights of the resulting interference spikes.

The applicant's patent application (DE 198 02 065.A1), which is a prior application, corresponding to U.S. Pat. No. 6,393,078, discloses a method for modulating a basic clock signal for digital circuits and a corresponding clock modulator in which the distances between adjacent switching edges are altered, the respective distance being achieved by virtue of the fact that the basic clock signal is conducted via a changing number of delay units and the distances between the adjacent switching edges are altered in this way.

This method and this clock modulator have the disadvantage that frequency modulation is achieved which, although it greatly attenuates the fundamental frequency, does not readily correspond to the fundamental frequency in terms of its time average,

SUMMARY OF THE INVENTION

The object of the invention, therefore, is to provide a method for the frequency modulation of a basic clock signal which outputs a modulated clock signal which is identical on average to the basic clock signal, and a corresponding clock modulator for implementing the method.

The object is achieved for a method the delay times of the delay units are calibrated, the delay units each having a plurality of delay elements and the delay elements being connected in or out individually and/or in groups. This makes it possible to compensate for effects such as, for example, current operating temperatures, changes in the voltage supply and ageing-dictated changes. This calibration is configured in a particularly simple manner if the delay elements are connected in or out in a stepwise approximated manner.

This calibration can be carried out particularly rapidly and with always the same number of steps if firstly, during a coarse calibration, the same number of delay elements is connected in or out in each case in all the delay units and then, in a fine calibration, a respective delay element in one or more delay units is connected in or out.

One manner of determining the distances between the switching edges may be realized by cyclically recurring random numbers, from which the respective distance is derived.

The selection of the random numbers becomes particularly simple if the random numbers are inverted after n cycles for n cycles and the inverted numbers are then used for deriving the switching edges. The effect achieved as a result of this is that even given an unfavorable selection of the random numbers used, the modulated frequency on average corresponds to the fundamental frequency. This makes it possible, for example, to use the modulated frequency to provide an accurate time base for a clock, for example.

By virtue of the fact that the switching edges are derived not only as a function of the random number but also as a function of a modulation factor, it is possible to realize different modulation factors.

One manner of determination of the next switching edge can be implemented by the formula specified herein. This makes it possible to freely select the modulation factor, the number of delay elements and of different random numbers or switching edges within the scope of the physical limits of the clock signal to be modulated and of the switching device.

It is also possible to assign a specific distance between the switching edges to each random number as a function of the modulation factor, the clock signal to be modulated and the switching device, to store these values in a memory and to read them out and use them as required.

A clock modulator according to the invention has a number of series-connected delay units with adjustable delay times between which taps are arranged, so that the basic clock signal can be conducted via a changing number of delay units and the distance between the switching edges can be altered in this way, the adjustability of the delay units being realized by virtue of the fact that the delay units are each constructed from a plurality of delay elements which can be connected and disconnected individually.

By virtue of the fact that the delay times of the delay units are adjustable, overall the clock modulator can be used for different fundamental frequencies and modulation factors.

The selection of the random numbers becomes simple by virtue of an inverting device for inverting the random numbers. This inverting device can be connected in after n cycles of the random numbers and can be disconnected again after a further n cycles. As long as the random numbers are inverted, the inverted random numbers, instead of the random numbers, are used for deriving the distances between adjacent switching edges. The effect achieved as a result of this is that the average clock duration of the modulated frequency is equal to the duration of the modulated basic clock signal, irrespective of the selection of the random numbers.

BRIEF DESCRIPTION OF THE DRAWINGS

The invention is explained in more detail below using exemplary embodiments.

In the figures of the drawings.

DETAILED DESCRIPTION OF THE PREFERRED EMBODIMENT

Figure 1:
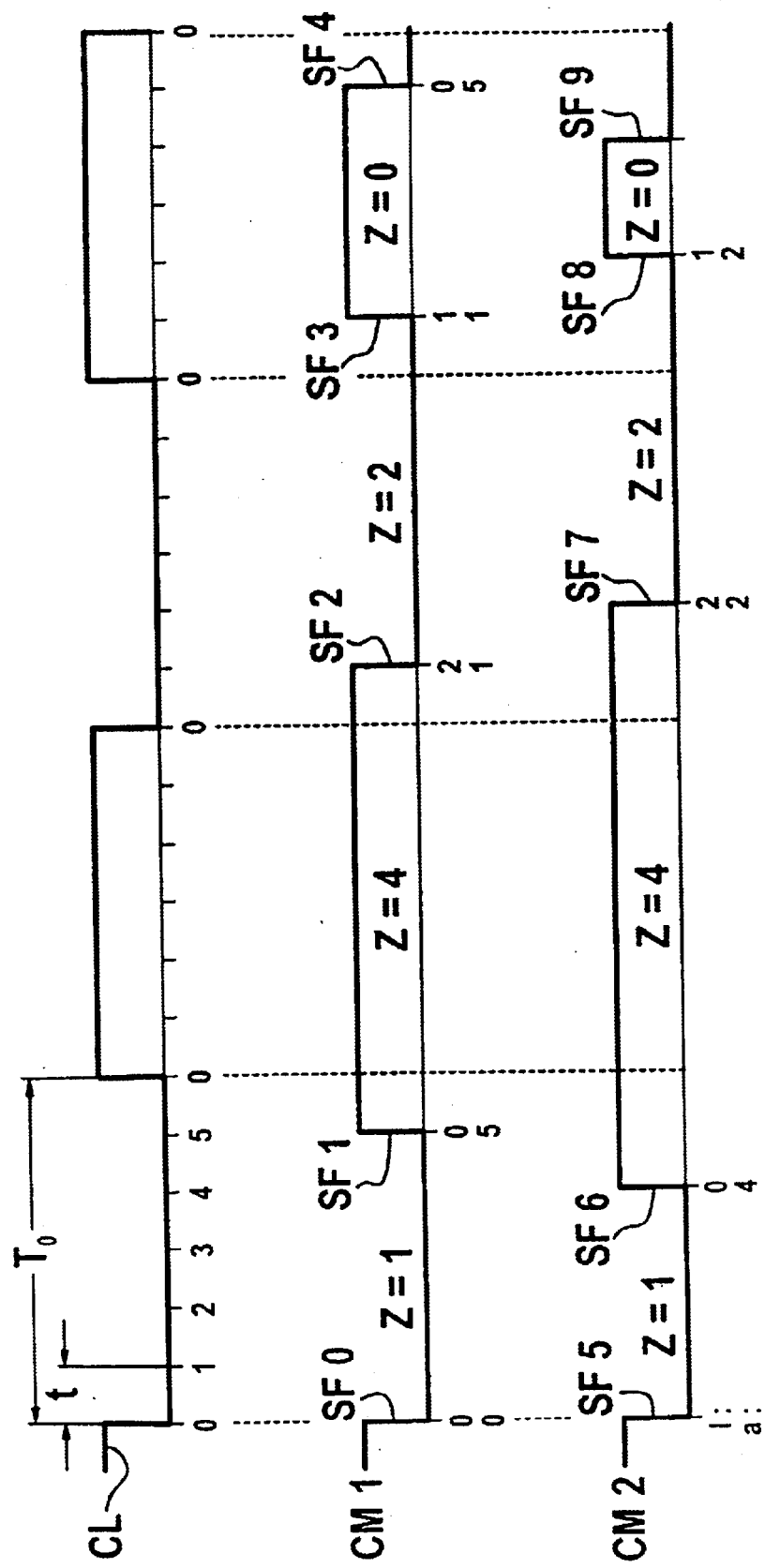
FIG. 1 shows a diagram containing the basic clock signal and the generation of the modulated clock signal.

FIG. 1 shows an unmodulated basic clock signal CL, whose half-periods $T_0$ are divided into 6 respective sections having the length t=1. A random number generator supplies 5 different random numbers Z 0 to 4 in periodic cycles. The distances between the individual switching edges of the clock signal to be modulated are determined depending on the random number Z and the modulation factor K. Thus, in the case of the middle random number (2), the distance between the adjacent switching edges amounts to a half-period $T_0$. Given a modulation factor of 1, the following distances between the switching edges result for the remaining random numbers.

0=4t
1=5t
3=7t
4=8t

For a modulation factor of 2, the following result for the random numbers:

0=2t
1=4t
3=8t
4=10t

One possibility for calculating the respective next switching edge SF is afforded by the following equation 1:

$$a_{i+1} = \left(a_i + p - \left(\frac{N-1}{2} - Z_{i+1}\right)K\right) \bmod p = X \bmod p \quad (1)$$

The following furthermore results:

$x = I*p + ax*t$ where I is the interval in which the next switching edge lies, p is the number of possible switching points per half-period $T_0$ and a is the position of the switching edge in the corresponding interval.

The calculation of the switching edge of the modulated clock signal CM 1 with the modulation factor 1 produces the following for the random number I at the beginning of the last switching edge SF 0 with the position a=0 in the interval 0:

$a_{i+1}=(0+6-(5-I/2-1)\times1) \bmod 6 = 5 \bmod 6$ $5=I*6+5*1$ from this it follows that:

I=0 a=5

This states that the switching edge SF 1 lies in the same interval at a=5. If I=1, the next switching edge lies in the next interval; at I=2, the switching edge lies in the next interval but one.

The following results for the switching edge SF 2:

$a_{i+1}=(5+6-(5-I/2-4)\times1) \bmod 6 = 13 \bmod 6$ $13=I*6+a*1$

I=1 a=1

This means that the switching edge SF 2 lies in the next interval but one given the value a=1.

The following results for the switching edge SF 3:

$a_{i+1}=(1+6-(5-I/2-2)\times1) \bmod 6 = 7 \bmod 6$ $7=I*6+a*1$

I=1 a=1

The following results correspondingly for the switching edge SF 4:

$a_{i+1}=(1+6-(5-I/2-0)\times1) \bmod 6 = 5 \bmod 6$ $5=I*6+a*1$

I=0 a=5

This means that the switching edge SF 4 lies in the same interval at the location 5.

For the clock signal CM 2 with the modulation factor 2, the following result for the switching edges SF 6 to SF 9:

For the switching edge SF 6:

$a_{i+1}=(0+6-(5-I/2-1)\times2) \bmod 6 = 4 \bmod 6$ $4=I*6+a*1$

I=0 a=4

For the switching edge SF 7:

$a_{i+1}=(4+6-(5-I/2-4)\times2) \bmod 6 = 14 \bmod 6$ $14=I*6+a*1$

I=2 a=2

For the switching edge SF 8:

$a_{i+1}=(2+6-(5-I/2-2)\times2) \bmod 6 = 8 \bmod 6$ $6=I*6+a*1$

I=1 a=2

For the switching edge SF 9:

$a_{i+1}=(2+6-(5-I/2-0)\times2) \bmod 6 = 4 \bmod 6$ $4=I*6+a*1$

I=0 a=4

Figure 2:
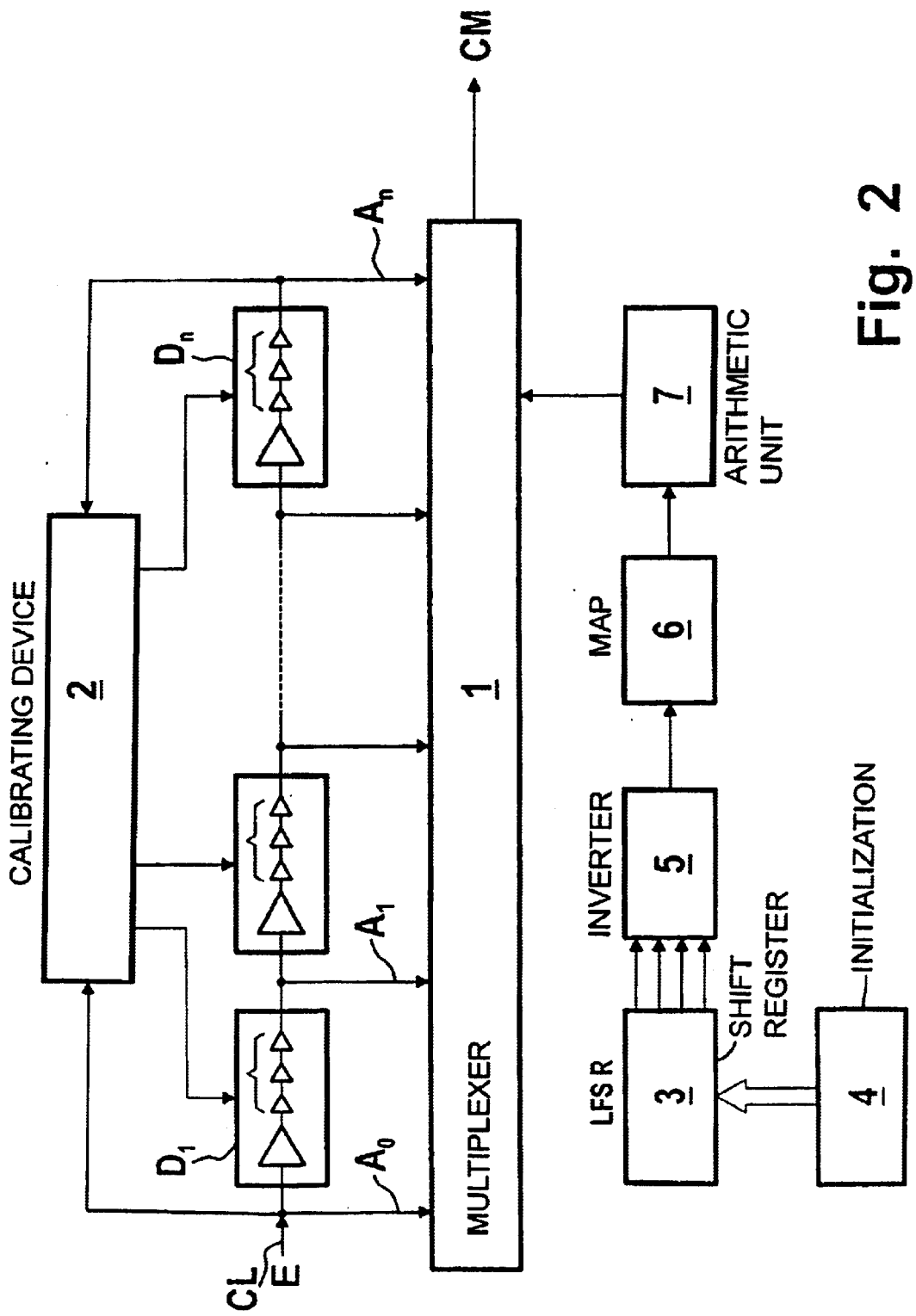
FIG. 2 shows a block diagram of a possible exemplary embodiment.

For block diagram of an exemplary embodiment of the clock modulator according to the invention in FIG. 2 has n series-connected delay units $D_1$ to $D_n$ with upstream and downstream taps $A_0$ to $A_n$ connected to a multiplexer 1. The individual delay units $D_1$ to $D_n$ each generate a delay having the length $t=2T_0/n$ with the result that the complete delay series delays the unmodulated basic clock signal CL present at the input E by a total of one period. A calibrating device 2 compares the basic clock signal CL present at the input E with the signal present at the output $A_n$ of the last delay element $D_n$. If the instants of the switching edges of the two signals do not correspond, the calibrating device 2 calibrates the delay units $D_1$ to $D_n$ in such a way that the two signals correspond.

m random numbers are generated cyclically with the aid of a feedback shift register 3.

Different random number sequences can be selected by means of an initialization device 4.

As soon as one cycle of the random numbers has ended, during the subsequent cycle the random numbers read from the feedback shift register are inverted by an inverter 5, in order to obtain uniform distribution of the random numbers and thus of the different delays. If there are an even number of different random numbers, said number is reduced by one in a map device 6, thereby producing an odd number of different random numbers. This reduction can be realized for example as follows: when the highest random number is present, it is not taken, rather the remaining random numbers are taken one after the other. This can be done for example as follows: when said highest random number is present, a counter which counts from zero up to the highest random number still allowed is read and is then incremented by one.

The random numbers thus obtained are used, as described above with reference to FIG. 1, in the arithmetic unit 7 in order to determine the tap $A_0$ to $A_n$ to which the multiplexer 1 must be switched so that the switching edge corresponding to the random number and to the modulation factor is obtained.

Figure 3:
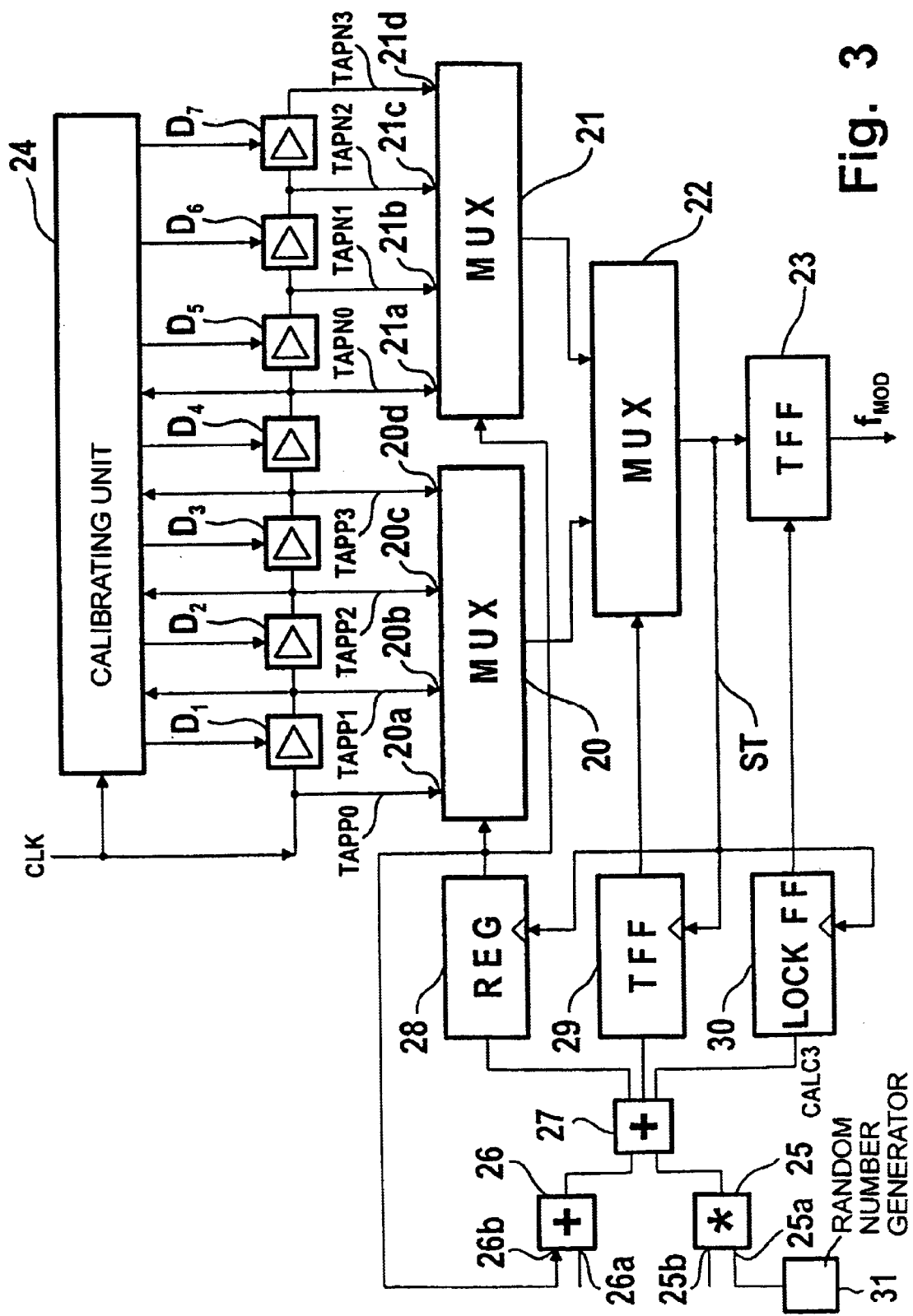
FIG. 3 shows an exemplary embodiment of a particularly preferred clock modulator.

In FIG. 3, 7 delay units $D_1$–$D_7$ are connected in series to form a delay chain via which the basic clock signal CLK is conducted. The basic clock signal CLK (corresponding to the signal TAPP0) and the signals TAPP1-P3 which leave the delay units $D_1$–$D_3$ are respectively present at an input 20a-d of a multiplexer 20, and the signals TAP N0–N3 which leave the delay units $D_4$–$D_7$ are present at a respective input 20a-d of the multiplexer 21. The outputs of the multiplexers 20, 21 are connected to the inputs of a multiplexer 22, whose output is connected to the input of a toggle flip-flop 23, at whose output the modulated clock signal $f_{MOD}$ is present.

In addition, the signals TAPP0–TAPP3 are also passed to a calibrating unit 24, which monitors whether the delay of said signals is correct. If this is not the case, the delay units $D_1$–$D_4$ are calibrated until the delay is correct. The values determined for delay units $D_1$–$D_4$ are also accepted for the delay units $D_5$ to $D_7$, since they have the same operating parameters as the delay units $D_1$–$D_4$, particularly if all the delay units $D_1$–$D_7$ or even the entire clock modulator are integrated in an IC. This calibration may be effected continually or at specific time intervals or, by way of example, may be carried out in the event of changes in specific parameters such as, for example, temperature or circuit.

FIG. 3 furthermore shows a multiplier 25, two adders 26, 27, a register 28, a toggle flip-flop 29, a lock flip-flop 30 and a random number generator 31.

Equation 1 can be rewritten as follows:

$$S = a_{i+1} = (a_i + K^* Z_{i+1} + c) \bmod p$$

where $c = p - ((N-1):2)^*K$

The next random number $Z_{i+1}$ is present at the input 25a, the modulation factor K is present at the input 25b, the constant c is present at the input 26a and the position $a_i$ of the preceding switching edge SF, which is read from the register 28, is present at the input 26b. The product from the multiplier 25 and the sum from the adder 26 are summed in the adder 27 to give a sum S. The highest bit of this sum S is passed to the set input of the lock flip-flop 30, the second highest bit is passed to the input of the toggle flip-flop 29, and the two remaining, lower bits are passed to the register 28. The output of the register 28 drives the two multiplexers 20, 21 and is furthermore fed back to an input of the adder 26.

Figure 4:
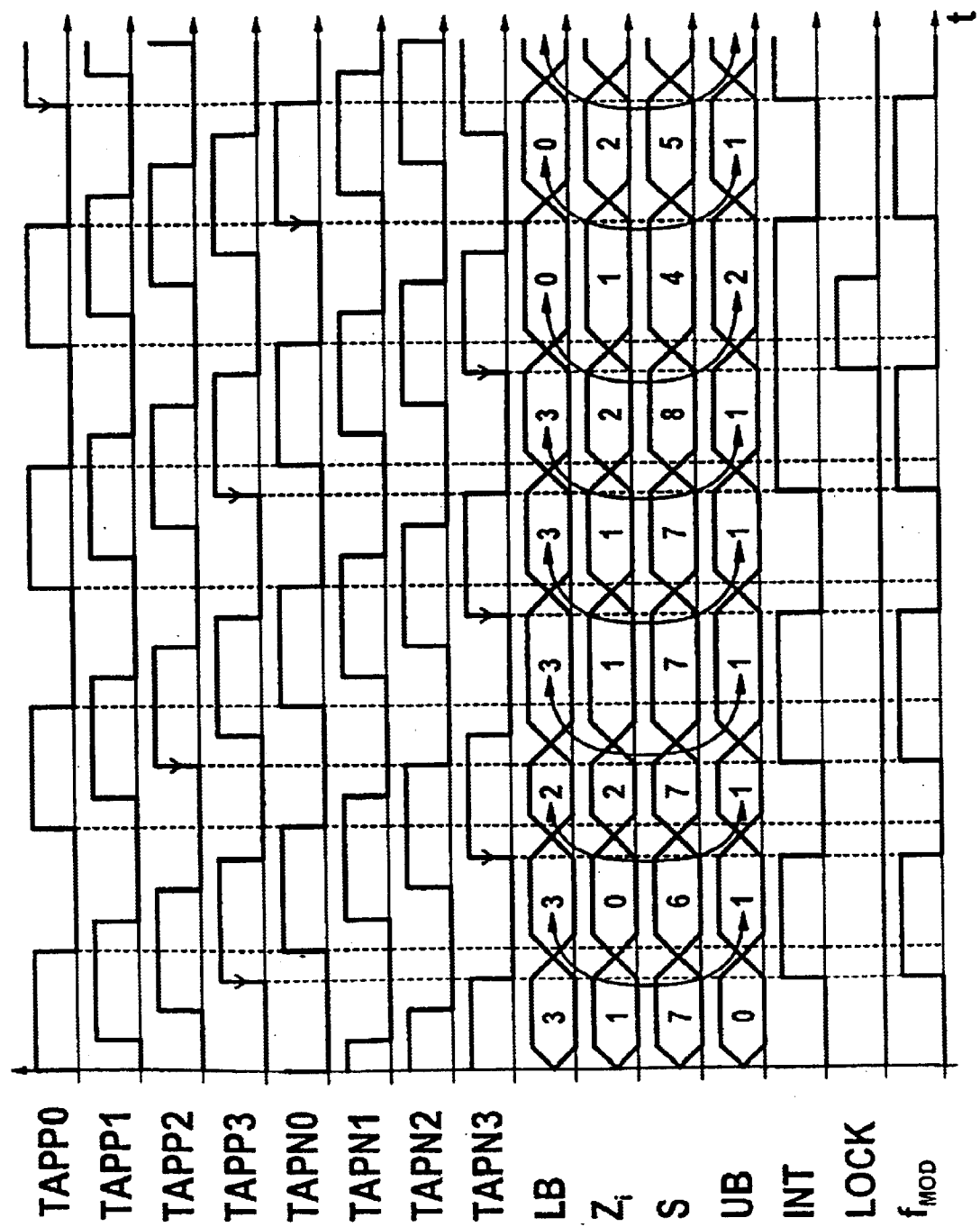
FIG. 4 shows a function diagram of the exemplary embodiment of FIG. 3.

FIG. 4 shows an exemplary illustration of the method of operation of the above-described clock modulator in the form of a diagram. In this case, TAPP0 to TAPP3 denote the signals which are present at the inputs of the multiplexer 20, and TAPN0 to N3 the signals which are present at the inputs of the multiplexer 21. LB denotes the number produced by the lowest two bits of the sum S and thus represents the number of the signal TAPP0–TAPP3 and TAPN0–TAPN3, $Z_i$ denotes the random number which is present in each case, UB denotes the number of the two upper bits of the sum S, INT denotes the output of the toggle flip-flop 29, and LOCK denotes the output of the lock flip-flop 30.

Suppose that the number of possible random numbers Z is =3, namely 0, 1 and 2, the number of possible switching points p per half-period $T_0$ is 4 (namely in each case the rising edge of TAPP0 to P3 and TAPN0 to N3) and the modulation factor is K=1.

Consequently, the sum S may have values of from 3 to 8, written digitally:

|   | UB | LB |
|---|----|----|
| 3 | 00 | 11 |
| 4 | 01 | 00 |
| 5 | 01 | 01 |
| 6 | 01 | 10 |
| 7 | 01 | 11 |
| 8 | 10 | 00 |

The modulation begins with the value 3 in the register 28, the random number $Z_i$=1 and the outputs of the flip-flops 29, 30 shall be at 0. If the value 0 is present at the input of the multiplexer 22, the latter switches through to the multiplexer 20, and to the multiplexer 21 in the case of the value 1. The 3 means that the input TAPP3 and respectively TAPN3 of the multiplexer 21 is switched through, with the result that the signal which is present downstream of the delay unit D3 is switched through, which signal, upon its next positive edge, will switch over the output of the toggle flip-flop 23.

The next input to be switched through, which is calculated in parallel with this:

$S = 3 + 1 \times 1 + 3 = 7$ or, in binary, 0 1 1 1 is accepted into the register 28, the toggle flip-flop 29 and the lock flip-flop 30 with the next positive edge of the signal ST which leaves the multiplexer 22.

Consequently, the lower two bits UB=11=3 and the upper bits exhibit 01=1. A 3 is thus present in the register 28, with the result that the inputs TAPP3 and TAPN3 are switched through; the second highest bit is a 1, with the result that the toggle flip-flop 29 changes over its output, to be precise from 0 to 1, with the result that the signal at the output of multiplexer 21 is switched through. Consequently, the positive edge of TAPN3 switches the toggle flip-flop 23 to 0 again. The further calculation proceeds correspondingly. If the sum S=8, digitally 1000, the lock flip-flop 30 inhibits the toggle flip-flop 23, with the result that it cannot change its output.

Figure 5:
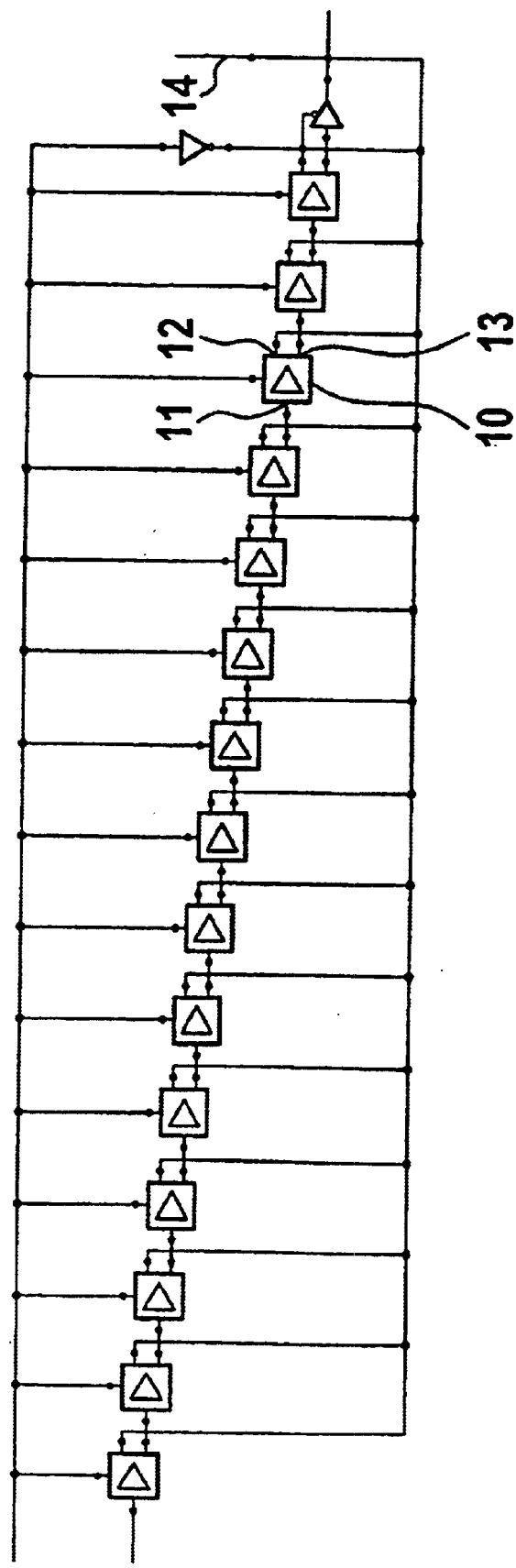
FIG. 5 shows a block diagram of an exemplary embodiment of a delay unit.

FIG. 5 reveals the possible structure of a delay unit D. The delay unit D comprises m series-connected delay elements 10. The delay elements 10 each have a clock input 11, two clock outputs 12, 13 and a control input 14. The respective clock output 12 is connected to the output 14 of the delay unit D, while the respective clock output 13 is connected to the clock input 11 of the respectively succeeding delay element 10. The control inputs 14 determine the clock output 12, 13 at which the (delayed) clock signal is present and thus whether the clock signal is to be delayed further or is to pass undelayed to the output 14. Consequently, the delay time of each delay unit D can be varied in a wide range.

Figure 6:
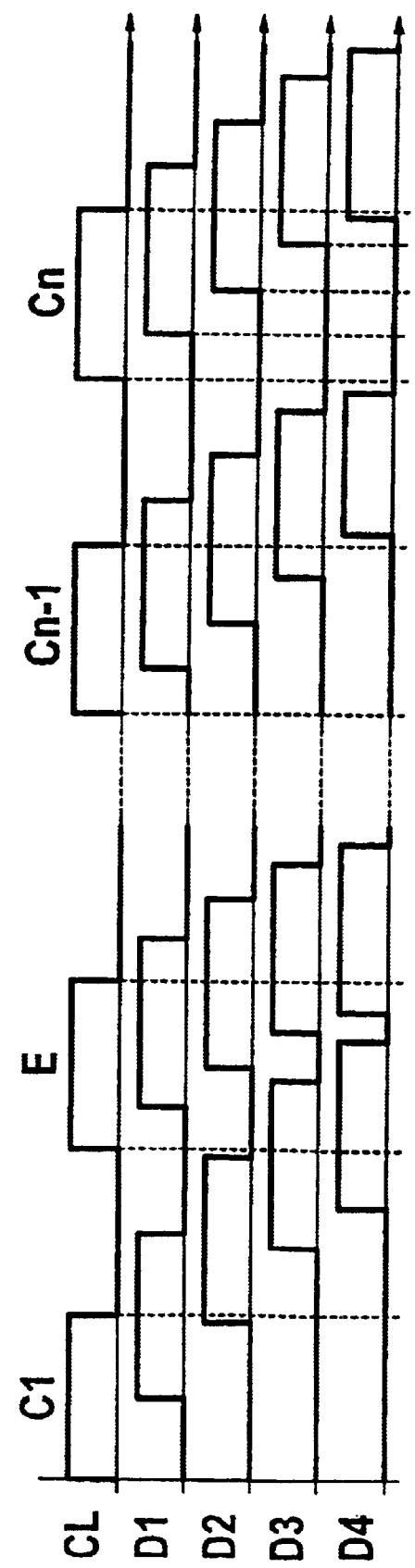
FIG. 6 shows a possibility for approximated calibration of series-connected delay units.

The timing diagram in FIG. 6 shows one possibility for approximated calibration of the delay units from FIG. 3. Firstly, in the first cycle C1, the same number of delay elements are used in each delay unit D1–D4 in order to delay the clock signal CL. Since the clock signal is delayed by more than one complete half-period in the case of the delay unit D4, an identical number of delay elements are in each case connected out in the delay units D1–D4. This is carried out in a plurality of steps with a decreasing number until, by connecting in or out a respective delay element in each delay unit, the clock signal is delayed by almost half a period in the case of the delay unit D4 and the end E of the coarse calibration is reached. Then, during the fine calibration, individual delay elements in a few or one delay unit are connected in or out until, in the penultimate step Cn−1, the clock signal is delayed by more than half a period in the case of the delay unit D4, so that then, in the last step Cn, by connecting out a delay element, the series of delay units have been calibrated in such a way that, in the case of the delay unit D4, the clock signal is shortened by less than the time duration of the delay of a delay element shorter than half a period of a clock signal.

The delay units D5–D7 are then set in a corresponding manner.

It is also possible to calibrate all the delay units D1–D7 simultaneously if a further delay unit (not illustrated) is also arranged downstream of the delay unit D7 and the delay units are calibrated in the manner described above unit, as a result of delay elements having been connected in or out, the clock signal at the output of the delay unit which is not illustrated is delayed by the duration of a complete period.

What is claimed is:

1. A method for modulating a basic clock signal for digital circuits, in which distances between adjacent switching edges are altered, the basic clock signal being conducted via a changing number of delay units for altering the distances between the adjacent switching edges, said method comprising the step of calibrating delay times of the delay units (D1–Dn), wherein the delay units (D1–Dn) each have a plurality of delay elements (10) which are controlled to impart zero delay or a non-zero value of delay to a clock signal individually or in groups of the delay elements; wherein the respective distance between two adjacent switching edges is derived from a random number of a random number generator; and wherein the distance between two successive switching edges is derived as a function of the random number and a modulation factor.

2. The method as claimed in claim 1, further comprising the step of calculating the position of a switching edge ($a_{i+1}$) succeeding a switching edge ($a_i$) as follows:

$$a_{i+1} = \left(a_i + p - \left(\frac{N-1}{2} - Z_{i+1}\right)K\right) \bmod p$$

where
  p represents the number of delay steps per half-period,
  N represents the number of possible switching edges,
  K represents the modulation factor, and
  Z represents the random number.

* * * * *